United States Patent
Kikuchi

(10) Patent No.: US 10,705,149 B2
(45) Date of Patent: Jul. 7, 2020

(54) VOLTAGE DROP DETECTION THROUGH DATA CORRUPTION DETECTION

(71) Applicant: FANUC CORPORATION, Yamanashi (JP)

(72) Inventor: Kazuya Kikuchi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/265,283

(22) Filed: Feb. 1, 2019

(65) Prior Publication Data

US 2019/0277920 A1    Sep. 12, 2019

(30) Foreign Application Priority Data

Mar. 8, 2018  (JP) ................ 2018-041770

(51) Int. Cl.
*G01R 31/3835*  (2019.01)
*G08B 21/18*    (2006.01)
*G01R 31/371*   (2019.01)

(52) U.S. Cl.
CPC ....... *G01R 31/3835* (2019.01); *G01R 31/371* (2019.01); *G08B 21/18* (2013.01)

(58) Field of Classification Search
CPC ... G01R 31/3835; G01R 31/371; G08B 21/18
See application file for complete search history.

(56) References Cited

U.S. PATENT DOCUMENTS

2016/0363632 A1* 12/2016 Park ................. G01R 31/3648

FOREIGN PATENT DOCUMENTS

| JP | H02-089111 A | 3/1990 |
|----|--------------|--------|
| JP | H06-188031 A | 7/1994 |
| JP | H07-234987 A | 9/1995 |
| JP | 2008-299759 A | 12/2008 |

OTHER PUBLICATIONS

An Office Action mailed by the Japanese Patent Office dated Mar. 10, 2020, which corresponds to Japanese Patent Application No. 2018-041770 and is related to U.S. Appl. No. 16/265,283.

* cited by examiner

*Primary Examiner* — Hongmin Fan
(74) *Attorney, Agent, or Firm* — Studebaker & Brackett PC

(57) ABSTRACT

An object is to provide a voltage drop detection system which can accurately detect a drop in the voltage of a backup battery when a main power supply is off. A voltage drop detection system detects a drop in the voltage of a battery that supplies power to a first volatile memory when a main power supply is off, and the voltage drop detection system includes: a second volatile memory which is connected for the battery in parallel with the first volatile memory; a data writing unit which writes data in the second volatile memory when the main power supply is on; a data corruption detection unit which supplies, when the main power supply is off, power from the battery to the first volatile memory and the second volatile memory and which thereafter detects the corruption of the data written in the second volatile memory when the main power supply is on; and a voltage drop detection unit which detects the drop in the voltage of the battery based on the detection of the corruption of the data when the main power supply is on.

3 Claims, 7 Drawing Sheets

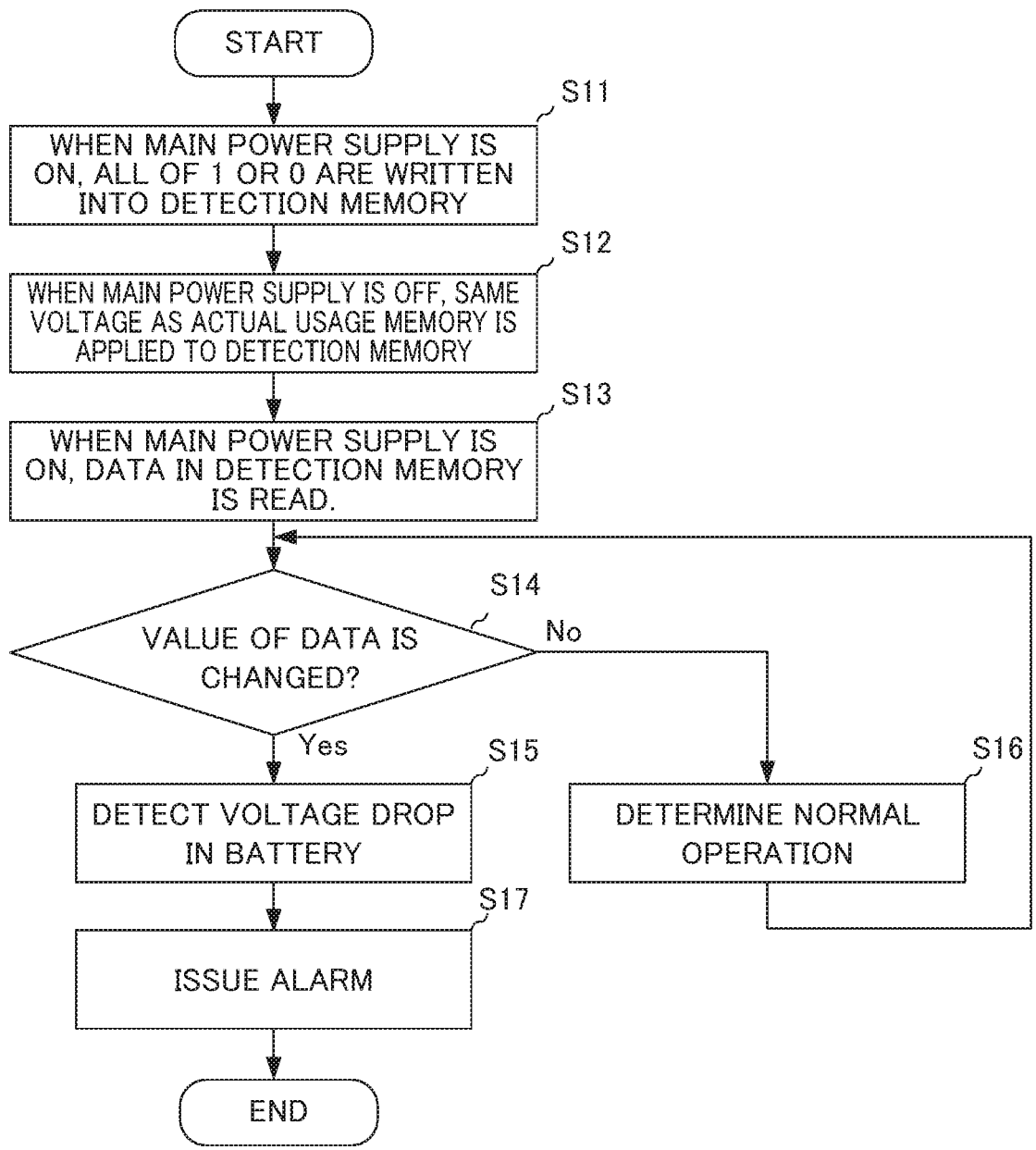

VOLTAGE DROP DETECTION THROUGH DATA CORRUPTION DETECTION

This application is based on and claims the benefit of priority from Japanese Patent Application No. 2018-041770, filed on 8 Mar. 2018, the content of which is incorporated herein by reference.

BACKGROUND OF THE INVENTION

Field of the Invention

The present invention relates to a voltage drop detection system which detects a drop in the voltage of a battery.

Related Art

Although, for example, in a numerical controller (CNC) or the like, in order to store various types of parameters, a volatile memory such as an SRAM which is backed up by a battery is used, data in the volatile memory cannot be held due to a drop in the voltage of the battery, and thus a means for detecting a drop in the voltage of the battery in an early stage is required.

In this regard, for example, patent document 1 discloses, in order to monitor the state of usage of a secondary battery to prevent the degradation of the secondary battery, a battery protection circuit that includes a storage means for storing, even in a stopped state, a comparison result of a battery voltage immediately before the stopped state which is one type of no-load state and a low voltage value which is close to a usage limit or the end voltage value of a degradation limit of the battery and that determines the state of usage of the secondary battery based on the comparison result stored in the storage means and a comparison result when power is turned on.

Patent document 2 discloses a numerical controller which includes a RAM that is backed up by a battery and in which when a battery voltage is insufficient, information that the battery is abnormal is displayed on an alarm diagnostic screen.

Patent Document 1: Japanese Unexamined Patent Application, Publication No. H6-188031
Patent Document 2: Japanese Unexamined Patent Application, Publication No. H7-234987

SUMMARY OF THE INVENTION

As disclosed in patent document 2, in a numerical controller, in general, when a main power supply is on, the voltage of a backup battery is monitored, and thus a drop in the voltage of the battery is detected.

However, as disclosed in FIG. 3 of patent document 1, depending on whether or not a load is provided for the battery, that is, whether the main power supply is off or on, the voltage is varied by the property of the battery itself, with the result that it is impossible to accurately detect a drop in the voltage of the battery when the main power supply is off.

An object of the present invention is to provide a voltage drop detection system which can accurately detect a drop in the voltage of a backup battery when a main power supply is off.

(1) A voltage drop detection system according to the present invention (for example, a "voltage drop detection system 1" which will be described later) is a voltage drop detection system which detects a drop in the voltage of a battery that supplies power to a first volatile memory (for example, a "first volatile memory 14" which will be described later) when a main power supply is off, and the voltage drop detection system includes: a second volatile memory (for example, a "second volatile memory 17" which will be described later) which is connected for the battery in parallel with the first volatile memory; a data writing unit (for example, a "data writing unit 111" which will be described later) which writes data in the second volatile memory when the main power supply is on; a data corruption detection unit (for example, a "data corruption detection unit 112" which will be described later) which supplies, when the main power supply is off, power from the battery to the first volatile memory and the second volatile memory and which thereafter detects the corruption of the data written in the second volatile memory when the main power supply is on; and a voltage drop detection unit (for example, a "voltage drop detection unit 113" which will be described later) which detects the drop in the voltage of the battery based on the detection of the corruption of the data when the main power supply is on.

(2) Preferably, the voltage drop detection system of (1), further includes: a step-down circuit (for example, a "step-down circuit 20" which will be described later) which steps down, during the warranty period of the battery, the voltage of power supplied from the battery to the second volatile memory when the main power supply is off such that the voltage drops below the lowest data holding voltage of the first volatile memory and the second volatile memory.

(3) Preferably, in the voltage drop detection system of (1), the lowest data holding voltage of the second volatile memory is higher than the lowest data holding voltage of the first volatile memory.

(4) Preferably, the voltage drop detection system of any one of (1) to (3), further includes: an alarm unit (for example, an "alarm unit 114" which will be described later) which issues an alarm when the drop in the voltage of the battery is detected.

According to the present invention, it is possible to provide a voltage drop detection system which can accurately detect a drop in the voltage of a backup battery when a main power supply is off.

BRIEF DESCRIPTION OF THE DRAWINGS

FIG. 7 is a flowchart showing the operation of the voltage drop detection system according to the second embodiment of the present invention.

DETAILED DESCRIPTION OF THE INVENTION

1 First Embodiment

Figure 1:
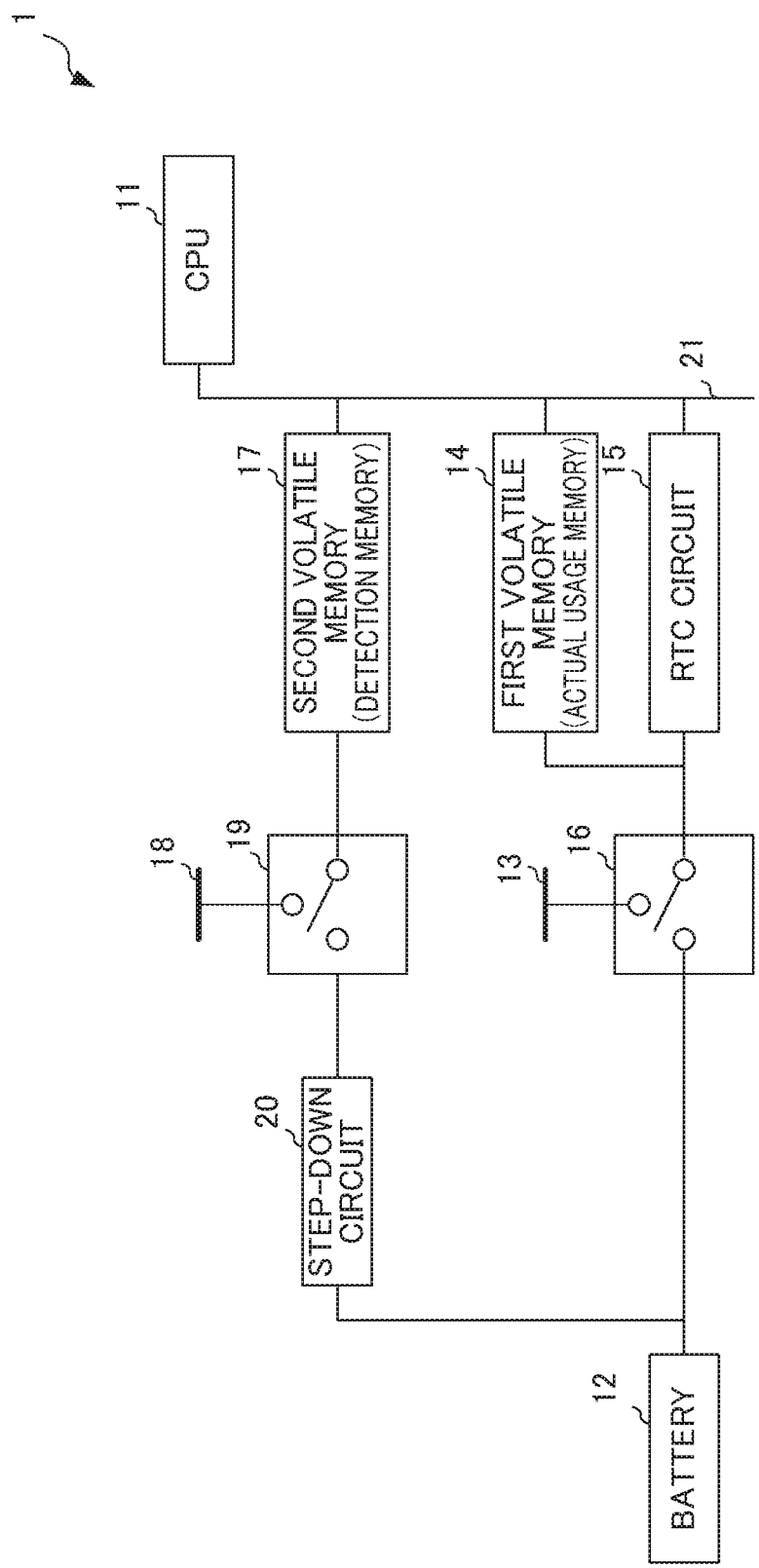
FIG. 1 is a diagram showing an overall configuration of a voltage drop detection system according to a first embodiment of the present invention.
Figure 2:
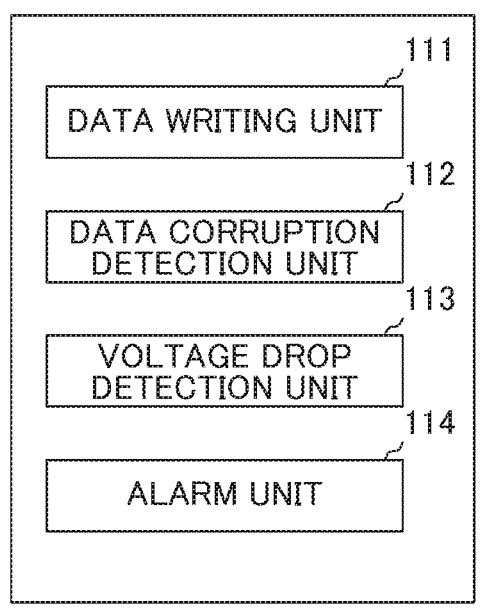
FIG. 2 is a diagram showing function blocks which are realized by a CPU included in the voltage drop detection system according to the first embodiment of the present invention.

A voltage drop detection system according to a first embodiment of the present invention will be described below with reference to FIGS. 1 to 4.
[1.1 Configuration of Invention]
FIG. 1 is a diagram showing an overall configuration of the voltage drop detection system 1 according to the first embodiment of the present invention.
The voltage drop detection system 1 is a system which detects a drop in the voltage of a battery 12 that backs up a first volatile memory 14 when a first main power supply 13 is off, and mainly includes a CPU 11, a second volatile memory 17 which is a dummy for voltage drop detection and a step-down circuit 20 which steps down the voltage of power supplied from the battery 12 to the second volatile memory 17.
In the following description, the first volatile memory 14 may be referred to as the "actual usage memory".
The second volatile memory 17 may be referred to as the "detection memory".

The lowest data holding voltage of the first volatile memory 14 and the lowest data holding voltage of the second volatile memory 17 are the same as each other.
The "lowest data holding voltage" refers to a voltage which is required at a minimum so that data written in the volatile memory is not corrupted and which is related to the volatile memory, and when a voltage applied to the volatile memory drops below the lowest data holding voltage, the data written in the volatile memory is not guaranteed.
In the following description, for convenience, it is assumed that when the voltage applied to the volatile memory drops below the lowest data holding voltage, the data written in the volatile memory is corrupted.
Although the first volatile memory 14 and the second volatile memory 17 are typically SRAMs, they are not limited to SRAMs.

Between the battery 12 and the first volatile memory 14, a switch circuit 16 is provided which switches the supply source of power supplied to the first volatile memory 14 between the battery 12 and the first main power supply 13. The switch circuit 16 switches the supply source of power to the first volatile memory 14 such that when the first main power supply 13 is on, power is supplied to the first volatile memory 14 from the first main power supply 13 whereas when the first main power supply 13 is off, power is supplied to the first volatile memory 14 from the battery 12.

An RTC (Real Time Clock) circuit 15 is provided for the battery 12 and the switch circuit 16 in parallel with the first volatile memory 14.
The RTC circuit 15 counts, as with a general digital clock, time with a crystal oscillator which is operated by the battery 12.
The output data thereof can be read from the CPU 11 which is connected through a bus 21 to the first volatile memory 14 and the RTC circuit 15.
Furthermore, the CPU 11 may write the output data read from the RTC circuit 15 into the first volatile memory 14.

The RTC circuit 15 is an example of a load which is provided for the battery 12 in parallel with the first volatile memory 14.
Another load may be provided in parallel with the first volatile memory 14.

The second volatile memory 17 is installed for the battery 12 in parallel with a group of the first volatile memory 14 and the RTC circuit 15.
Between the battery 12 and the second volatile memory 17, a switch circuit 19 is provided which switches the supply source of power supplied to the second volatile memory 17 between the battery 12 and a second main power supply 18. The switch circuit 19 switches the supply source of power to the second volatile memory 17 such that when the second main power supply 18 is on, power is supplied to the first volatile memory 14 from the second main power supply 18 whereas when the second main power supply 18 is off, power is supplied to the first volatile memory 14 from the battery 12.

Furthermore, the step-down circuit 20 is provided between the battery 12 and the switch circuit 19.
The step-down circuit 20 is a circuit which steps down the voltage of power supplied from the battery 12 to the second volatile memory 17.
In this way, the voltage of power supplied from the battery 12 to the second volatile memory 17 is lower than the voltage of power supplied from the battery 12 to the first volatile memory 14.
Furthermore, during the warranty period of the battery 12, the step-down circuit 20 steps down the voltage such that when the main power supply is off, the voltage of power supplied from the battery 12 to the second volatile memory 17 is lower than the lowest data holding voltage of the first volatile memory 14 and the second volatile memory 17.

The CPU 11 is connected through the bus 21 to the first volatile memory 14, the RTC circuit 15 and the second volatile memory 17.
The CPU 11 is a processor which totally controls the voltage drop detection system 1, and can write data into the first volatile memory 14 and the second volatile memory 17 and read data from the first volatile memory 14 and the second volatile memory 17.
As described previously, the CPU 11 can read the output data from the RTC circuit 15.
Furthermore, the CPU 11 reads various types of programs as necessary from a storage region such as a ROM, a RAM, a flash memory or a hard disk (HDD) so as to execute them, and thereby realizes the functions of a data writing unit 111, a data corruption detection unit 112, a voltage drop detection unit 113 and an alarm unit 114 shown in the function block diagram of FIG. 2.

The data writing unit 111 writes data into the first volatile memory 14 and the second volatile memory 17, and in particular, when the second main power supply 18 is on, the data writing unit 111 writes data into the second volatile memory 17.
Although for example, the data which is written into the second volatile memory 17 may be data in which all are 0 or data in which all are 1, there is no limitation to this configuration. Any data may be adopted as long as corruption can be detected with the data corruption detection unit 112 as will be described later when the data written therein is corrupted.

When the first main power supply 13 and the second main power supply 18 are off, power is supplied from the battery 12 to the first volatile memory 14 and the second volatile memory 17, and thereafter when the first main power supply 13 and the second main power supply 18 are turned on again, the data corruption detection unit 112 detects the corruption of data written in the second volatile memory 17.

When as described above, the data writing unit 111 writes, into the second volatile memory 17, data in which all are 0, the data corruption detection unit 112 detects the corruption of the data by detecting the presence of data which is changed from 0.

Likewise, when the data writing unit 111 writes, into the second volatile memory 17, data in which all are 1, the data corruption detection unit 112 detects the corruption of the data by detecting the presence of data which is changed from 1.

The voltage drop detection unit 113 is triggered by the detection of the corruption of the data written in the second volatile memory 17 with the data corruption detection unit 112 to detect a drop in the voltage of the battery 12 and hence the degradation of the battery 12.

The alarm unit 114 is triggered by the detection of the drop in the voltage of the battery 12 with the voltage drop detection unit 113 to issue, to the outside of the voltage drop detection system 1, an alarm indicating that the voltage of the battery 12 is lowered and that hence the battery 12 is degraded.

[1.2 Method of Detecting Voltage Drop]

Figure 3:
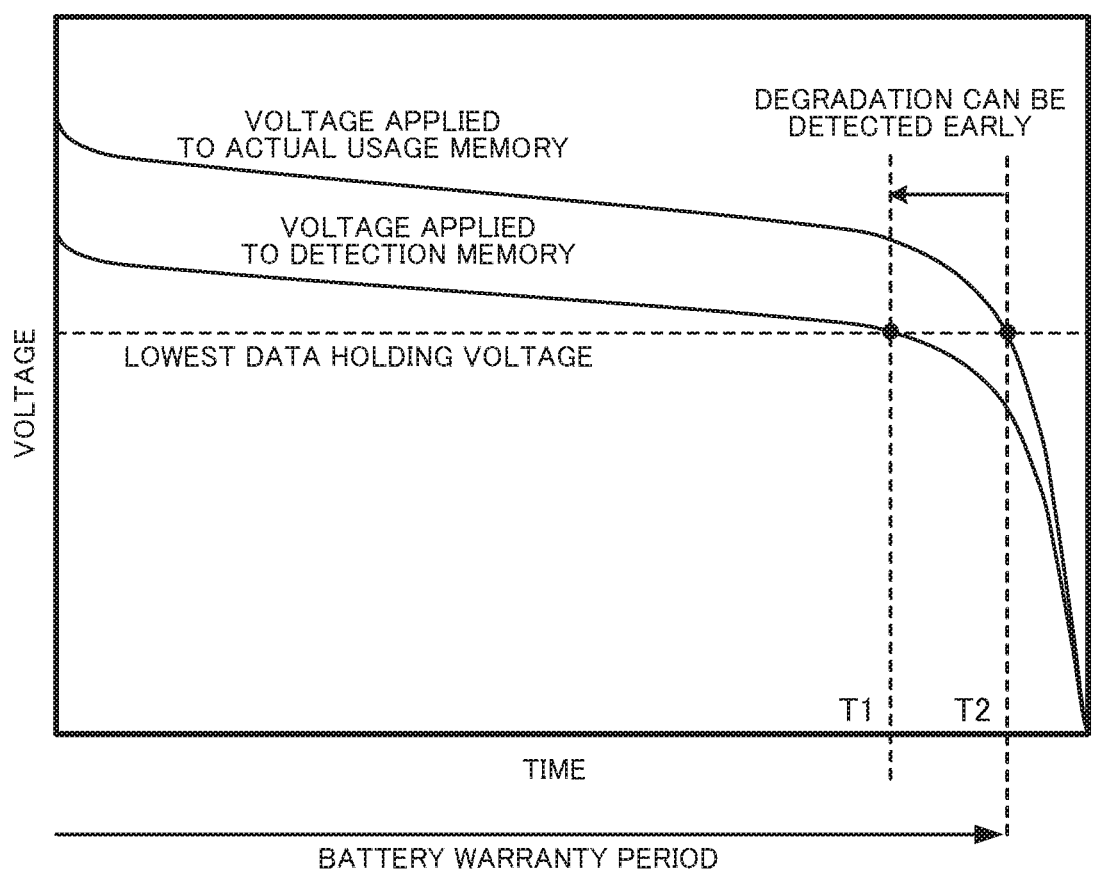
FIG. 3 is a graph showing chronological changes in voltages applied to an actual usage memory and a detection memory in the voltage drop detection system according to the first embodiment of the present invention.

FIG. 3 shows changes in voltages applied from the battery 12 to the first volatile memory 14 (actual usage memory) and the second volatile memory 17 (detection memory) as time passes.

As time passes, the voltages applied to the first volatile memory 14 (actual usage memory) and the second volatile memory 17 (detection memory) are lowered while S-shaped curves are being drawn.

More specifically, for a short period of time after the start of the application of the voltage, the voltages are rapidly lowered, then the voltages are gently lowered for a long period of time and thereafter the voltages are rapidly lowered again.

Here, since the step-down circuit 20 is present, the voltage applied to the second volatile memory 17 (detection memory) is lower than the voltage applied to the first volatile memory 14 (actual usage memory) so as to drop below the lowest data holding voltage at a time T1 in FIG. 3 earlier than the voltage applied to the first volatile memory 14 (actual usage memory).

Consequently, at the time T1, the data written in the second volatile memory 17 (detection memory) is corrupted.

Thereafter, at a time T2 (>T1) during the battery warranty period, the voltage applied to the first volatile memory 14 (actual usage memory) drops below the lowest data holding voltage such that the data written in the first volatile memory 14 (actual usage memory) is corrupted.

The data corruption detection unit 112 detects the corruption of the data written in the second volatile memory 17 (detection memory) at the time T1 which is earlier than the time T2, and thus before the data written in the first volatile memory 14 (actual usage memory) is corrupted, the data corruption detection unit 112 can detect the drops in the voltages applied from the battery 12 to the first volatile memory 14 (actual usage memory) and the second volatile memory 17 (detection memory) and hence, the degradation of the battery 12.

[1.3 Operation of Voltage Drop Detection System]

Figure 4:
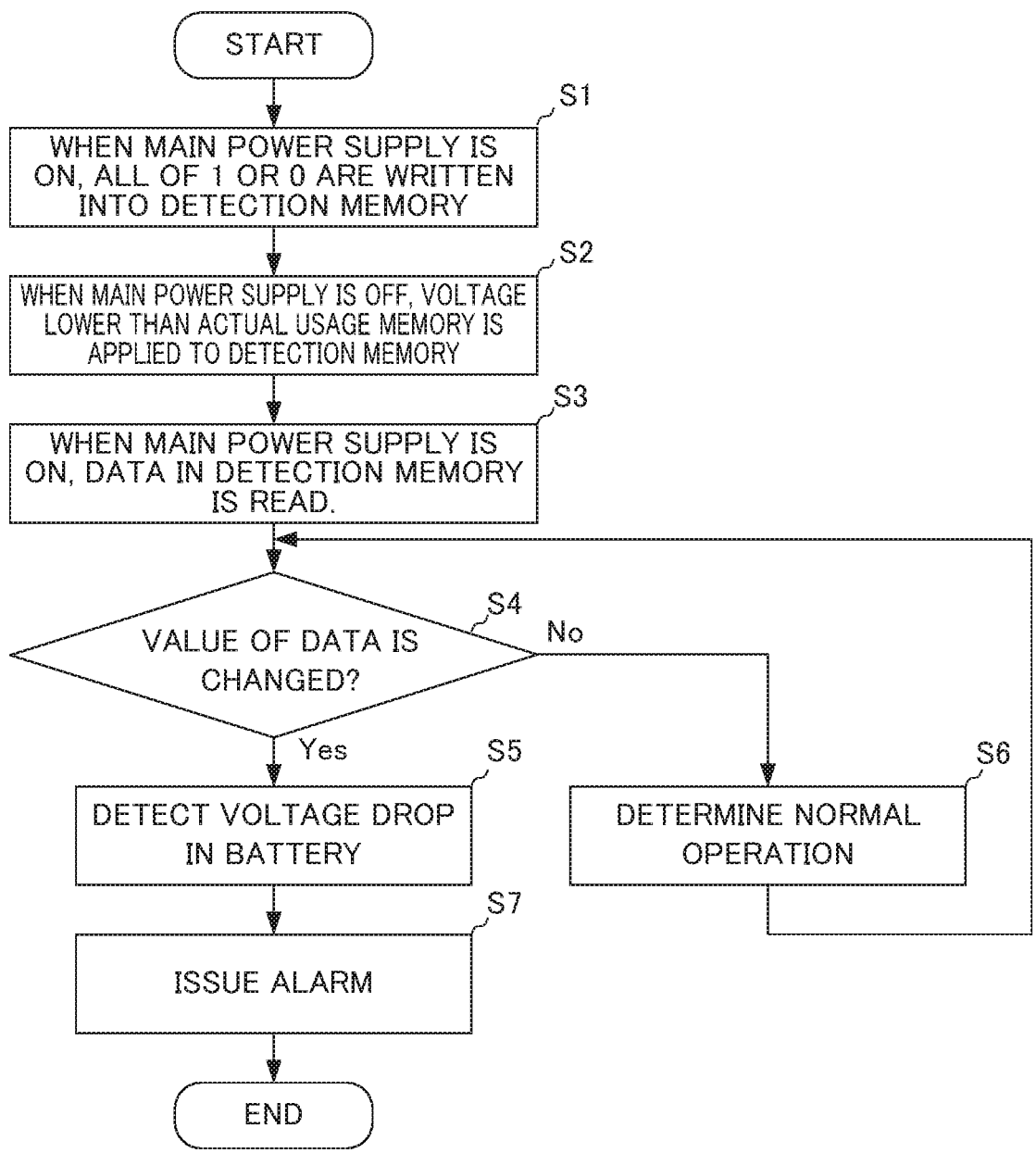
FIG. 4 is a flowchart showing the operation of the voltage drop detection system according to the first embodiment of the present invention.

FIG. 4 is a flowchart showing the operation of the voltage drop detection system 1.

In step S1, when the first main power supply 13 and the second main power supply 18 are on, the data writing unit 111 writes, into the second volatile memory 17 (detection memory), data in which all are 0 or data in which all are 1.

In step S2, when the first main power supply 13 and the second main power supply 18 are off, as a backup, voltages are applied to the first volatile memory 14 (actual usage memory) and the second volatile memory 17 (detection memory), and here, the voltage applied from the battery 12 to the second volatile memory 17 is stepped down by the step-down circuit 20 so as to be lower than the voltage applied to the first volatile memory 14 (actual usage memory) and to drop below the lowest data holding voltage of the first volatile memory 14 (actual usage memory) and the second volatile memory 17 (detection memory) during the warranty period of the battery 12.

In step S3, when the first main power supply 13 and the second main power supply 18 are on, the data corruption detection unit 112 reads the data written in the second volatile memory 17 (detection memory).

In step S4, when the data written in the second volatile memory 17 (detection memory) is changed, that is, when the data corruption detection unit 112 detects that the data written in the second volatile memory 17 (detection memory) is corrupted (S4: yes), the process is transferred to step S5. When the data written in the second volatile memory 17 (detection memory) is not changed, that is, when the data corruption detection unit 112 does not detect that the data written in the second volatile memory 17 (detection memory) is corrupted (S4: no), the process is transferred to step S6.

In step S5, the voltage drop detection unit 113 detects a drop in the voltage of the battery 12 and hence the degradation of the battery 12.

In step S6, the voltage drop detection unit 113 determines that the battery 12 is in a normal state.

Thereafter, the process is returned to step S4.

In step S7, the alarm unit 114 issues, to the outside of the voltage drop detection system 1, an alarm indicating that the voltage of the battery 12 is lowered and that hence the battery 12 is degraded.

[1.4 Effects Achieved in First Embodiment]

In the voltage drop detection system 1 according to the first embodiment, when the main power supply is on, the data is written into the second volatile memory 17, thereafter during a period in which the main power supply is off, power is supplied from the battery 12 to the second volatile memory 17 and then when the main power supply is on, the corruption of the data written in the second volatile memory 17 is detected, with the result that the voltage drop detection system 1 is triggered by the detection of the corruption of the data to detect a drop in the voltage of the battery 12. In this way, it is possible to accurately detect a drop in the voltage of the backup battery when the main power supply is off.

The voltage drop detection system 1 includes the step-down circuit 20 between the battery 12 and the second volatile memory 17.

In this way, before the corruption of the data written in the first volatile memory 14, it is possible to detect a drop in the voltage of the battery 12.

The voltage drop detection system 1 issues the alarm indicating that the voltage of the battery 12 is lowered. In this way, the user of the voltage drop detection system 1 can easily grasp the degradation of the battery 12.

2 Second Embodiment

A voltage drop detection system according to a second embodiment of the present invention will be described below with reference to FIGS. 5 and 6.

[2.1 Configuration of Invention]

Figure 5:
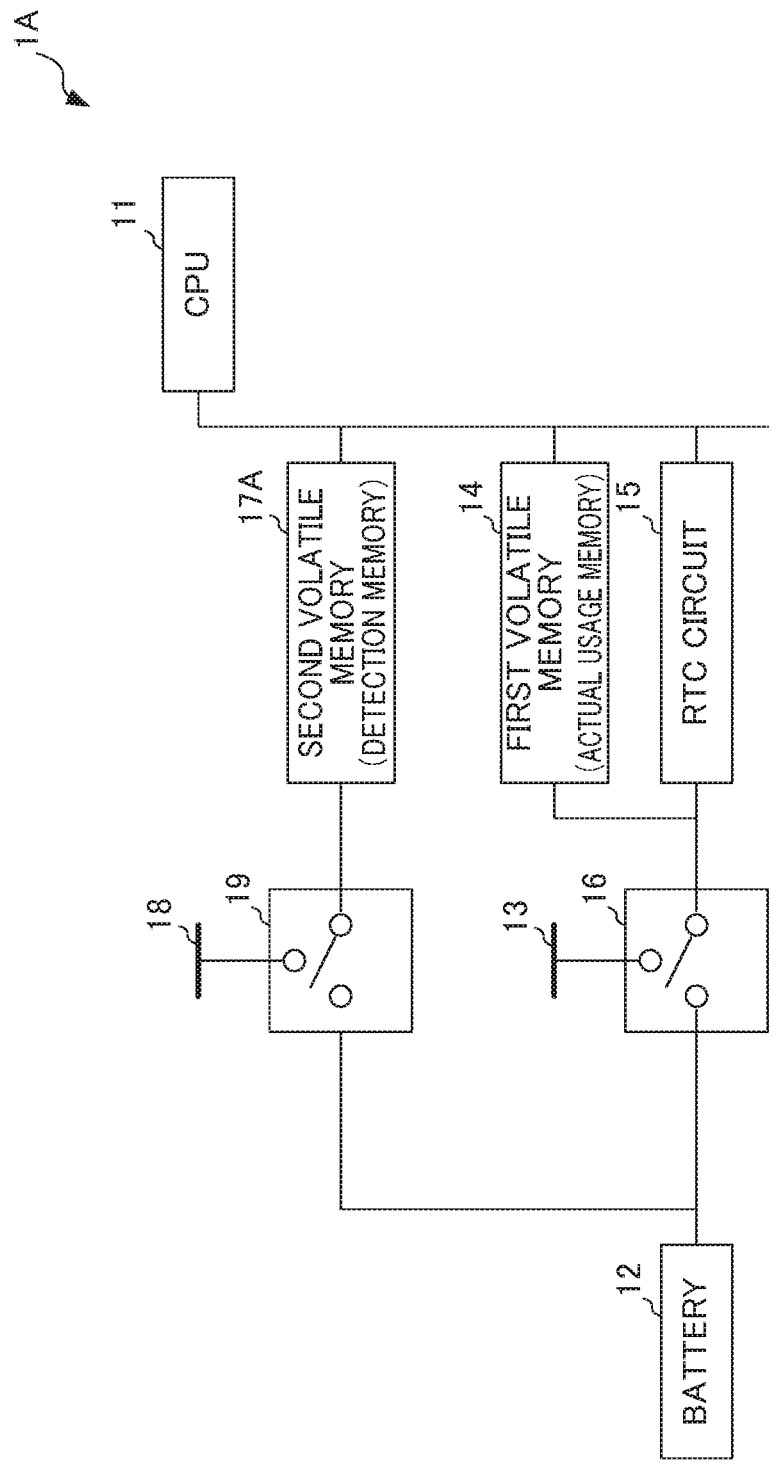
FIG. 5 is a diagram showing an overall configuration of a voltage drop detection system according to a second embodiment of the present invention.

FIG. 5 is a diagram showing an overall configuration of the voltage drop detection system 1A according to the second embodiment of the present invention.

In the following description, for simplification of the description, among constituent elements included in the voltage drop detection system 1A, the same constituent elements as those included in the voltage drop detection system 1 are identified with the same reference numerals, the description thereof will be omitted and points at which the voltage drop detection system 1A differs from the voltage drop detection system 1 according to the first embodiment will be mainly described.

The voltage drop detection system 1A differs from the voltage drop detection system 1 in that the voltage drop detection system 1A does not include the step-down circuit 20. In the voltage drop detection system 1, the lowest data holding voltage of the second volatile memory 17 is the same as that of the first volatile memory 14.

By contrast, the lowest data holding voltage of the second volatile memory 17A which is included in the voltage drop detection system 1A instead of the second volatile memory 17 is higher than the lowest data holding voltage of the first volatile memory 14.

The individual function blocks realized by the CPU 11 are the same as in the first embodiment, and thus the description thereof will be omitted.

[2.2 Method of Detecting Voltage Drop]

Figure 6:
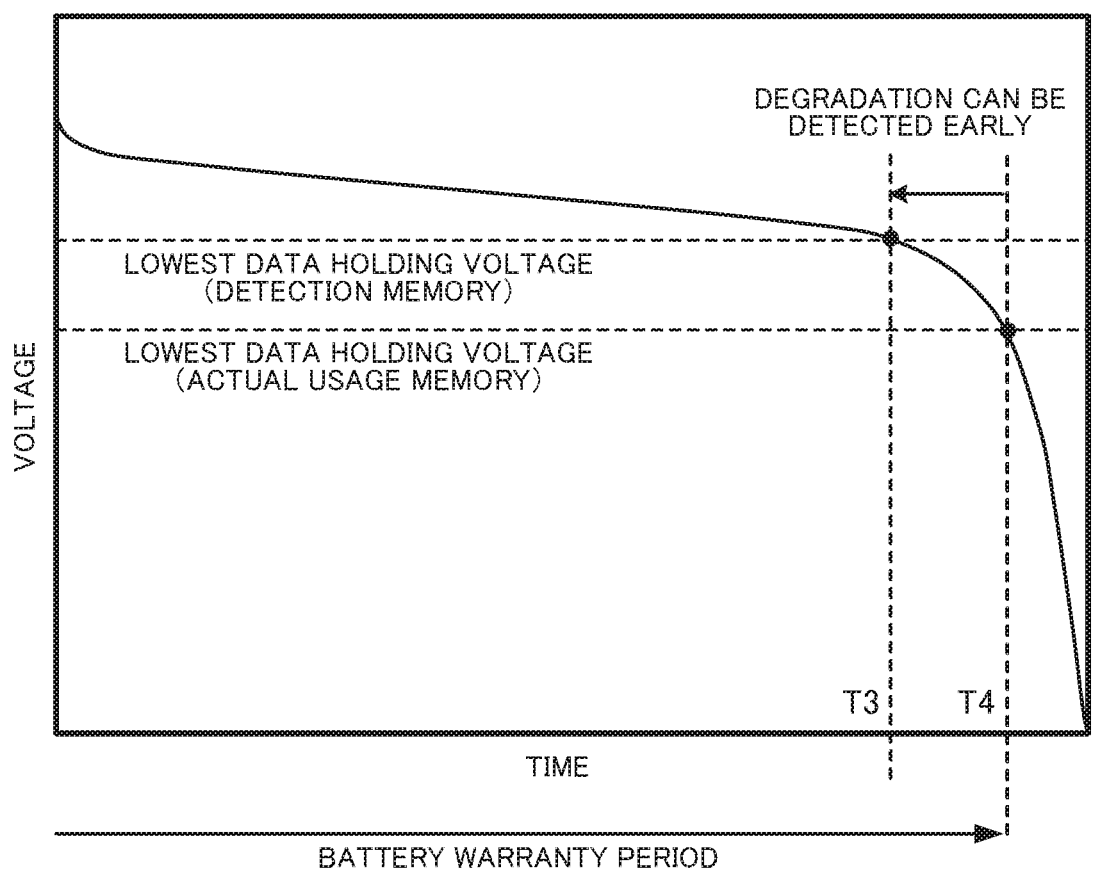
FIG. 6 is a graph showing chronological changes in voltages applied to an actual usage memory and a detection memory in the voltage drop detection system according to the second embodiment of the present invention.

FIG. 6 shows changes in voltages applied from the battery 12 to the first volatile memory 14 (actual usage memory) and the second volatile memory 17A (detection memory) as time passes.

As time passes, the voltages applied to the actual usage memory and the detection memory are lowered while S-shaped curves are being drawn.

Since in the voltage drop detection system 1A according to the second embodiment, the step-down circuit 20 is not present, the voltage applied from the battery 12 to the second volatile memory 17A (detection memory) is the same as the voltage applied from the battery 12 to the first volatile memory 14 (actual usage memory).

Hence, in the first volatile memory 14 (actual usage memory) and the second volatile memory 17A (detection memory), the same S-shaped curves are drawn.

However, the lowest data holding voltage of the second volatile memory 17A (detection memory) is higher than the lowest data holding voltage of the first volatile memory 14 (actual usage memory), and thus the voltage applied to the second volatile memory 17 (detection memory) drops below the lowest data holding voltage at a time T3 in FIG. 6 earlier than the voltage applied to the first volatile memory 14 (actual usage memory).

Consequently, at the time T3, the data written in the second volatile memory 17A (detection memory) is corrupted.

Thereafter, at a time T4 (>T3) during the battery warranty period, the voltage applied to the first volatile memory 14 (actual usage memory) drops below the lowest data holding voltage such that the data written in the first volatile memory 14 (actual usage memory) is corrupted.

The data corruption detection unit 112 detects the corruption of the data written in the second volatile memory 17A (detection memory) at the time T3 which is earlier than the time T4, and thus before the corruption of the data written in the first volatile memory 14 (actual usage memory), the data corruption detection unit 112 can detect the drops in the voltages applied from the battery 12 to the first volatile memory 14 (actual usage memory) and the second volatile memory 17A (detection memory) and hence, the degradation of the battery 12.

[2.3 Operation of Voltage Drop Detection System]

FIG. 7 is a flowchart showing the operation of the voltage drop detection system 1A.

In step S11, when the first main power supply 13 and the second main power supply 18 are on, the data writing unit 111 writes, into the second volatile memory 17A (detection memory), data in which all are 0 or data in which all are 1.

In step S12, when the first main power supply 13 and the second main power supply 18 are off, as a backup, voltages whose magnitudes are equal to each other are applied from the battery 12 to the first volatile memory 14 (actual usage memory) and the second volatile memory 17A (detection memory).

In step S13, when the first main power supply 13 and the second main power supply 18 are on, the data corruption detection unit 112 reads the data written in the second volatile memory 17A (detection memory).

In step S14, when the data written in the second volatile memory 17A (detection memory) is changed, that is, when the data corruption detection unit 112 detects that the data written in the second volatile memory 17A (detection memory) is corrupted (S14: yes), the process is transferred to step S15.

When the data written in the second volatile memory 17A (detection memory) is not changed, that is, when the data corruption detection unit 112 does not detect that the data written in the second volatile memory 17A (detection memory) is corrupted (S14: no), the process is transferred to step S16.

In step S15, the voltage drop detection unit 113 detects a drop in the voltage of the battery 12 and hence the degradation of the battery 12.

In step S16, the voltage drop detection unit 113 determines that the battery 12 is in a normal state.

Thereafter, the process is returned to step S14.

In step S17, the alarm unit 114 issues, to the outside of the voltage drop detection system 1A, an alarm indicating that the voltage of the battery 12 is lowered and that hence the battery 12 is degraded.

[2.4 Effects Achieved in Second Embodiment]

In the voltage drop detection system 1A according to the second embodiment, unlike the voltage drop detection system 1 according to the first embodiment, the second volatile memory 17A whose lowest data holding voltage is different from that of the first volatile memory 14 is included, and thus the step-down circuit 20 is not included.

In this way, with a circuit simpler than that in the first embodiment, before the corruption of the data written in the first volatile memory 14, it is possible to detect a drop in the voltage of the battery 12.

Although the embodiments of the present invention are described above, the present invention is not limited to the embodiments described above.

The effects described in the present embodiments are simply a list of most preferred effects produced from the present invention, and the effects of the present invention are not limited to those described in the present embodiments.

The voltage drop detection methods in the voltage drop detection systems 1 and 1A are realized by software. When they are realized by software, programs which configure the software are installed in computers included in the voltage drop detection systems 1 and 1A.

The programs may be recorded in a removable medium so as to be distributed to the user or may be downloaded through a network to the computer of the user so as to be distributed.

Furthermore, the programs may be provided to the computer of the user as a web service through a network without being downloaded.

EXPLANATION OF REFERENCE NUMERALS 1, 1A voltage drop detection system
11 CPU
12 battery
13, 18 main power supply
14 first volatile memory
17, 17A second volatile memory
15 RTC circuit
16, 19 switch circuit
20 step-down circuit
21 bus
111 data writing unit
112 data corruption detection unit
113 voltage drop detection unit
114 alarm unit

What is claimed is:

1. A voltage drop detection system which detects a drop in a voltage of a battery that supplies power to a first volatile memory when a main power supply is off, the voltage drop detection system comprising:
   a second volatile memory which is connected for the battery in parallel with the first volatile memory;
   a step-down circuit which steps down a voltage of power supplied from the battery to the second volatile memory;
   a first switch circuit which switches a supply source of power supplied to the first volatile memory between the battery and the main power supply, the first switch circuit provided between the battery and the first volatile memory;
   a second switch circuit which switches a supply source of power supplied to the second volatile memory between the battery and the main power supply, the second switch circuit provided between the step-down circuit and the second volatile memory;
   a data writing unit which writes data in the second volatile memory when the main power supply is on;
   a data corruption detection unit which supplies, when the main power supply is off, power from the battery to the first volatile memory and the second volatile memory and which thereafter detects corruption of the data written in the second volatile memory when the main power supply is on; and
   a voltage drop detection unit which detects the drop in the voltage of the battery based on the detection of the corruption of the data when the main power supply is on.

2. The voltage drop detection system according to claim 1, wherein
   the step-down circuit steps down the voltage of power supplied from the battery to the second volatile memory when the main power supply is off, such that the voltage of power supplied from the battery to the second volatile memory drops below a lowest data holding voltage of the first volatile memory and the second volatile memory during a warranty period of the battery.

3. The voltage drop detection system according to claim 1, further comprising: an alarm unit which issues an alarm when the drop in the voltage of the battery is detected.

* * * * *